(12) United States Patent
Uemura

(10) Patent No.: US 7,915,640 B2
(45) Date of Patent: Mar. 29, 2011

(54) HETEROJUNCTION SEMICONDUCTOR DEVICE AND METHOD OF MANUFACTURING

(75) Inventor: Masaya Uemura, Tokyo (JP)

(73) Assignee: Sony Corporation, Tokyo (JP)

( * ) Notice: Subject to any disclaimer, the term of this patent is extended or adjusted under 35 U.S.C. 154(b) by 980 days.

(21) Appl. No.: 11/419,348

(22) Filed: May 19, 2006

(65) Prior Publication Data

US 2008/0203426 A1  Aug. 28, 2008

(30) Foreign Application Priority Data

May 25, 2005  (JP) ................ P2005-152570

(51) Int. Cl.
*H01L 21/02* (2006.01)
*H01L 31/102* (2006.01)
*H01L 29/66* (2006.01)
*H01L 31/00* (2006.01)
*H01L 21/331* (2006.01)
*H01L 21/8222* (2006.01)

(52) U.S. Cl. .............. 257/190; 257/11; 257/12; 257/15; 257/18; 257/20; 257/183; 257/185; 257/187; 257/189; 257/191; 257/E29.188; 257/E21.371; 438/312

(58) Field of Classification Search .......... 257/190, 257/E29.188, E21.371, 11, 12, 15, 18, 20, 257/24, 183, 185, 187, 189, 191, 194, 197, 257/200; 438/312
See application file for complete search history.

(56) References Cited

U.S. PATENT DOCUMENTS

| | | | |
|---|---|---|---|
| 5,371,389 A * | 12/1994 | Matsuno et al. | 257/197 |
| 6,294,018 B1 * | 9/2001 | Hamm et al. | 117/90 |
| 6,697,412 B2 * | 2/2004 | Beam et al. | 372/96 |
| 6,855,613 B1 * | 2/2005 | Hamm et al. | 438/312 |
| 6,949,395 B2 * | 9/2005 | Yoo | 438/47 |
| 2003/0077847 A1 * | 4/2003 | Yoo | 438/22 |
| 2003/0151066 A1 * | 8/2003 | Pierson et al. | 257/197 |

FOREIGN PATENT DOCUMENTS

JP  2001156301 A  *  6/2001

OTHER PUBLICATIONS

Zheng et al. Metamorphic InP/InGaAs double-heterojunction bipolar transistors on GaAs grown by molecular-beam epitaxy; Applied Physics Letters; vol. 77, No. 6; Aug. 7, 2000.*

H.Q. Zheng et al.; Metamorphic InP/InGaAs double-heterojunction bipolar transistor on GaAs grown by molecular-beam epitaxy; Applied Physics Letters; vol. 77, No. 6, Aug. 7, 2000.

* cited by examiner

*Primary Examiner* — Zandra Smith
*Assistant Examiner* — Jeremy J Joy
(74) *Attorney, Agent, or Firm* — SNR Denton US LLP

(57) ABSTRACT

A metamorphic buffer layer is formed on a semi-insulating substrate by an epitaxial growth method, a collector layer, a base layer, an emitter layer and an emitter cap layer are sequentially laminated on the metamorphic buffer layer, and a collector electrode is provided in contact with an upper layer of the metamorphic buffer layer. The metamorphic buffer layer is doped with an impurity, in a concentration equivalent to or higher than that in a conventional sub-collector layer, by an impurity doping process during crystal growth so that the metamorphic buffer layer will be able to play the role of guiding the collector current to the collector electrode. Since the sub-collector layer, which is often formed of a ternary mixed crystal or the like having a high thermal resistance, can be omitted, the heat generated in the semiconductor device can be rapidly released into the substrate.

14 Claims, 10 Drawing Sheets

HETEROJUNCTION SEMICONDUCTOR DEVICE AND METHOD OF MANUFACTURING

CROSS REFERENCES TO RELATED APPLICATIONS

The present invention contains subject matter related to Japanese Patent Application JP 2005-152570 filed with the Japanese Patent Office on May 25, 2005, the entire contents of which being incorporated herein by reference.

BACKGROUND OF THE INVENTION

The present invention relates to a heterojunction semiconductor device having a metamorphic buffer layer and a method of manufacturing, particularly to an improvement of thermal conductivity in the semiconductor device.

In recent years, the demand for a higher speed and a higher degree of integration of semiconductor devices has been becoming stronger. For example, the expectation for a heterojunction bipolar transistor (HBT) using a Group III-V compound semiconductor has been increasing.

An HBT is usually manufactured by a method in which, for example, a sub-collector layer, a collector layer, a base layer, an emitter layer and an emitter cap layer are sequentially epitaxially grown on a gallium-arsenic (GaAs) substrate or indium-phosphorus (InP) substrate by use of a molecular beam epitaxy process (MBE process), a metalloorganic chemical vapor deposition (MOCVD) process or the like, and the resulting laminate is processed further.

At present, materials capable of lattice matching with indium-phosphorus (InP) have a high electron mobility and a high saturated speed and, therefore, are expected as a material with which it is possible to manufacture a semiconductor device having further excellent high-frequency characteristics. However, an indium-phosphorus substrate is difficult to produce and is very expensive, so that most makers have not yet reached to the mass production of the indium-phosphorus substrate.

In view of the above, attention has been paid in recent years to a semiconductor device in which a material capable of lattice matching with indium-phosphorus is laminated on a gallium-arsenic substrate excellent in mechanical strength and capable of being produced comparatively inexpensively. In this case, a large difference in lattice constant, i.e., lattice mismatching exists between the gallium-arsenic crystal and the indium-phosphorus crystal; therefore, there is a need for a technology for growing a single crystal layer while alleviating such a lattice mismatching. The technology is called metamorphic technology, and a heterojunction bipolar transistor manufactured by use of the metamorphic technology is called metamorphic HBT (MHBT).

A buffer layer formed for alleviating the lattice mismatching by the metamorphic technology is called metamorphic buffer layer. The metamorphic buffer layer is a crystal layer of which a lattice constant gradually varies due, for example, to gradual variation in the composition of atoms constituting the crystal. By causing a gradual variation in the composition, the lattice constant can be varied while maintaining the growth of the single crystal.

The metamorphic buffer layer can be formed, for example, of a ternary mixed crystal $In_xGa_{1-x}As$ ($0 \leq x \leq 1$) composed of indium, gallium and arsenic. In the case where the proportion x of indium, i.e., the molar fraction x of indium based on the sum total of indium and gallium is small, the lattice constant of the ternary mixed crystal is substantially equal to the lattice constant of the gallium-arsenic crystal and, therefore, the ternary mixed crystal is in lattice matching with the gallium-arsenic substrate. On the other hand, where x is about 0.50, the lattice constant of the ternary mixed crystal is substantially equal to that of the indium-phosphorus crystal and, therefore, the ternary mixed crystal shows lattice matching with the indium-phosphorus material.

Therefore, when the metamorphic buffer layer composed of the ternary mixed crystal $In_xGa_{1-x}As$ is laminated on the gallium-arsenic substrate while gradually varying continuously or stepwise the proportion x of indium from $x \approx 0$ to $x \approx 0.50$, a lower layer of the metamorphic buffer layer can be formed in lattice matching with the gallium-arsenic substrate and, simultaneously, a chemical semiconductor layer composed of an indium-phosphorus material can be grown, with good crystallinity, on an upper layer of the metamorphic buffer layer. The metamorphic buffer layer composed of the ternary mixed crystal $In_xGa_{1-x}As$ is formed by a vapor phase growth method using an MBE (molecular beam epitaxy) apparatus or the like, and is formed as a continuous crystal, though a difference in lattice constant exists between the lower layer and the upper layer. Besides, strain is absorbed in the lower layer, and transfer of dislocations into the upper layer is prevented from occurring, whereby the crystal lattice in the upper layer can be orderly conditioned.

In the metamorphic technology at present, it has been reported that the dislocation density is the lowest in the case where an indium-gallium-arsenic ternary mixed crystal layer is formed as a metamorphic buffer layer to be formed on a gallium-arsenic substrate. Other than the indium-gallium-arsenic layer, examples of the metamorphic buffer layer to be formed on the gallium-arsenic substrate include ternary mixed crystal layers such as an indium-aluminum-arsenic (InAlAs) layer and binary crystal layers such as an indium-phosphorus (InP) layer.

In the case of forming a metamorphic buffer layer composed of an indium-phosphorus binary crystal layer, first, an indium-phosphorus layer to be a lowermost layer of the metamorphic buffer layer is formed directly on the gallium-arsenic substrate. Since there is a large difference in lattice constant between gallium-arsenic and indium-phosphorus, many faults and/or dislocations are generated in the indium-phosphorus layer. However, the dislocations and/or faults can be restricted into the lower layer of the buffer layer by conducting a treatment for relaxing the strains in the crystal, such as a thermal annealing treatment, in the course of further laminatingly forming a buffer layer composed of the indium-phosphorus layer on the lowermost layer. For example, the thermal annealing treatment may be carried out several times during the formation of the buffer layer, whereby the dislocations can be reduced gradually.

FIG. 7 is a sectional diagram showing the structure of a related-art metamorphic HBT 100 described in Applied Physics Letters, 77(6), 869 to 871 (Aug. 7, 2000). In this metamorphic HBT 100, a metamorphic buffer layer 102 is formed on a semi-insulating substrate 1, then a sub-collector layer 110, a collector layer 3, a base layer 4, an emitter layer 5 and an emitter cap layer 6 are laminated thereon in a mesa form, and a collector electrode 107, a base electrode 8 and an emitter electrode 9 are provided in contact with the sub-collector layer 110, the base layer 4 and the emitter cap layer 6, respectively.

For example, the metamorphic HBT 100 is an npn type HBT, in which a metamorphic buffer layer 102 composed of a ternary mixed crystal $In_xGa_{1-x}As$ is laminated on a semi-insulating substrate 1 composed of gallium-arsenic (GaAs). The proportion of indium in the buffer layer 102 is as low as x≈0 at the lowermost portion of a lower layer 102a in lattice matching with the gallium-arsenic substrate 1, is gradually increased continuously or stepwise as one goes from the lower layer 102a through an intermediate layer 102b to an upper layer 102c, and reaches a high value of x≈0.50 at an uppermost portion of the upper layer 102c in lattice matching with an indium-phosphorus material. The thickness of the buffer 102 is generally about 1 to 2 μm. Incidentally, the classification into the lower layer 102a, the intermediate layer 102b and the upper layer 102c used here is a classification of the buffer layer 102 into three regions on a functional and conceptual basis, based on the differences of the mating materials with which the regions can be in lattice matching. Therefore, the classification does not necessarily mean that these layers have clear boundaries therebetween (here and hereinafter).

The sub-collector layer 110 is an $n^+$ type InGaAs layer having an impurity concentration of not less than $1\times10^{19}/cm^3$, and has a thickness of 300 to 500 nm. The collector layer 3 is an $n^-$ type InP layer having an impurity concentration of $1\times10^{16}/cm^3$, and the thickness thereof is 500 nm. The base layer 4 is a $p^+$ type InGaAs layer having an impurity concentration of not less than $1\times10^{19}/cm^3$, and has a thickness of 75 nm. The emitter layer 5 is an $n^-$ type InP layer having an impurity concentration of $1\times10^{17}/cm^3$, and the thickness thereof is 125 nm. The emitter cap layer 6 is an $n^+$ type InGaAs layer having an impurity concentration of not less than $1\times10^{19}/cm^3$, and has a thickness of 50 nm.

In the case of producing an HBT on a metamorphic buffer layer 102 as in the above-mentioned example, normally, in order to make electrical connection with the collector layer 3 and to smoothly guide a collector current to the collector electrode 107, a highly conductive sub-collector layer 110 is formed between the collector layer 3 and the metamorphic buffer layer 102, to thereby reduce the contact resistance and sheet resistance of the sub-collector layer 110. In this case, since an InGaAs layer is not only high in electron mobility but also capable of much reducing the ohmic resistance when in contact with metal, the InGaAs layer is often used as the sub-collector layer 110.

Meanwhile, in the case of using such a metamorphic HBT 100 as a power amplifier, the transistor may show a thermorunaway due to the heat generated by the device. In order to prevent the thermorunaway, it is desirable that the materials constituting the metamorphic HBT 100, particularly, the materials constituting the metamorphic buffer layer 102 and the sub-collector layer 110 which are located near the substrate 1 should be materials high in thermal conductivity. However, ternary mixed crystals often used as the metamorphic buffer layer 102 and the sub-collector layer 110 are low in thermal conductivity, as compared with binary crystals, and may therefore produce problems.

FIG. 8 is a graph showing the relationship between the proportion x of indium (the molar fraction of indium based on the sum total of indium and gallium) and thermal conductivity, of an indium-gallium-arsenic ternary system $In_xGa_{1-x}As$ at room temperature (300 K) (P. D. Maycock, Solid-State Electronics, vol. 10, Issue 3, 161 to 168 (1967)). It is seen from FIG. 8 that the thermal conductivity of the $In_xGa_{1-x}As$ system is high at the gallium-arsenic binary crystal where x=0 and at the indium-arsenic binary crystal where x=1 and that the thermal conductivities of other ternary mixed crystals are conspicuously lower than the thermal conductivities of these binary crystals. Particularly, the thermal conductivity of the $In_xGa_{1-x}Ar$ system is the lowest at the composition where x 0.50, which composition shows lattice matching with the indium-phosphorus material and is therefore preferable for use as the upper layer 102c of the metamorphic buffer layer 102 and the sub-collector layer 110.

A similar tendency is seen also for other ternary mixed crystals than the above, such as indium-aluminum-arsenic (InAlAs). In general, ternary mixed crystals represented by InGaAs and InAlAs are lower in thermal conductivity than binary crystals such as GaAs and InP. Moreover, the proportions x of In in the InGaAs layer and the InAlAs layer which show lattice matching with the indium-phosphorus material are as high as about 50%, which is the most disadvantageous from the viewpoint of thermal conductivity. Therefore, the use of a ternary mixed crystal such as InGaAs and InAlAs as a material for constituting a metamorphic HBT leads to a worsened heat release performance of the metamorphic HBT. When the heat release performance is worsened, thermal breakdown resistance (i.e., thermorunaway resistance) is largely degraded, whereby the output from the metamorphic HBT as a power device is limited. In addition, there may occur the problems that the operation of the device becomes instable due to variations in transistor characteristics with temperature variation and that it becomes necessary to introduce a ballast resistance to the emitter layer 5 for restraining the instable operation.

As has been above-mentioned, where a ternary mixed crystal layer of InGaAs or InAlAs is formed as a metamorphic buffer layer on a gallium-arsenic substrate, there is obtained the merit on one hand that the dislocation density is minimized. On the other hand, there is the demerit that the heat release performance of the metamorphic HBT is worsened, and device characteristics under high voltage are degraded largely. Therefore, in order to minimize the lowering in thermal conductivity, it may be necessary to reduce as much as possible the bulk or proportion of the ternary mixed crystal layer included in the metamorphic HBT.

In addition, in the case where a layer of InP which is a binary crystal having a comparatively good thermal conductivity is used for forming the metamorphic buffer layer, the heat release performance of the metamorphic buffer layer is enhanced, as compared with the case of using an InGaAs layer or an InAlAs layer. Even in this case, however, it is desirable to use the InGaAs layer which is not only high in electron mobility but also capable of being much lowered in ohmic resistance when in contact with metal, for forming the sub-collector layer 110, and it may therefore be necessary to reduce the lowering in thermal conductivity due to the sub-collector layer 110.

SUMMARY OF THE INVENTION

Thus, there is a need for a heterojunction semiconductor device which includes a metamorphic buffer layer and which has an improved thermal conductivity, and a method of manufacturing the same.

In order to fulfill the above need, according to an embodiment of the present invention, there is provided a heterojunction semiconductor device including a metamorphic buffer layer on a substrate, and an active layer on the metamorphic buffer layer, wherein of layers constituting the metamorphic buffer layer, at least a semiconductor layer in contact with the active layer contains an impurity introduced therein in a high concentration, and an electrode is provided in contact with the high-concentration impurity-containing layer.

In the heterojunction semiconductor device configured as above, a current flowing in the active layer is taken out to the electrode through the high-concentration impurity-containing layer. Therefore, the need for a current take-out layer provided only for taking out a current, such as a sub-collector layer in a heterojunction bipolar transistor according to the related art, is eliminated, whereby layer configuration can be simplified, and the lowering in thermal conductivity due to the presence of the current take-out layer such as the sub-collector layer can be obviated.

As a result, the heat release performance of a heterojunction semiconductor device can be improved, and, when the heterojunction semiconductor device is used as a power device, the output can be enhanced, the power consumption can be reduced, and the degradation of device characteristics due to temperature variations can be reduced.

In addition, where the heterojunction semiconductor device is a heterojunction bipolar transistor, variations in the transistor characteristics and thermorunaway are restrained from being generated due to temperature variations, and reliability of the device is enhanced. As a result, the need for a ballast resistance or the like is eliminated, so that it is possible to reduce the number of manufacturing process steps, to enhance productivity, and to lower the manufacturing cost.

According to another embodiment of the present invention, there is provided a method of manufacturing the just-mentioned heterojunction semiconductor device, including the steps of:

forming the metamorphic buffer layer on the substrate;

forming the active layer on the metamorphic buffer layer; and introducing an impurity into at least that semiconductor layer of layers constituting the metamorphic buffer layer which is in contact with the active layer.

By the method as above, the above-mentioned heterojunction semiconductor device can be manufactured efficiently.

DETAILED DESCRIPTION OF THE PREFERRED EMBODIMENTS

Figure 1:
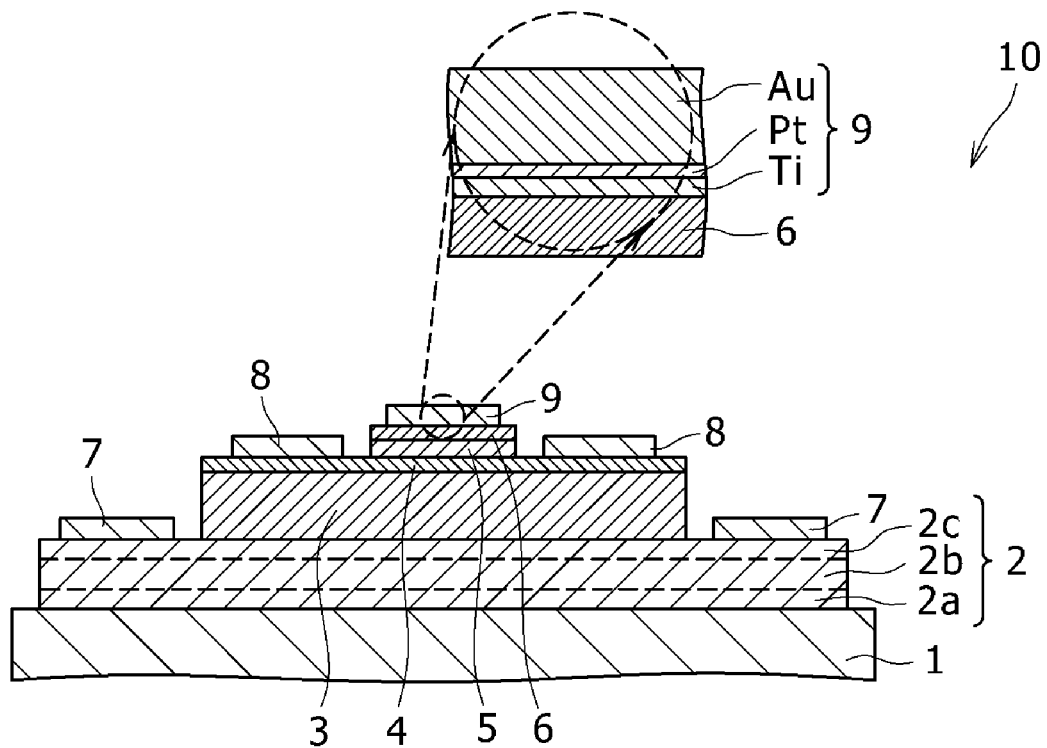
FIG. 1 is a sectional diagram showing the structure of a metamorphic HBT based on Embodiment 1 of the present invention.

In the present invention, it is preferable that the heterojunction semiconductor device is configured as a bipolar transistor, i.e., a heterojunction bipolar transistor (HBT) in which the active layer is composed at least of a collector layer, a base layer and an emitter layer, and the electrode is a collector electrode. The present invention is particularly effective in the case where the HBT is a power transistor, and the invention may be applied also to a power device of a diode or the like.

In this case, it is preferable that the metamorphic buffer layer is formed of a material capable of lattice matching with indium-phosphorus (InP), and the substrate is formed of gallium-arsenic (GaAs). As has been described above, the indium-phosphorus material is a material which has a high electron mobility and a high saturated speed and with which it is possible to manufacture a semiconductor device excellent in high-frequency characteristics. On the other hand, the gallium-arsenic substrate is a material which has the same zinc blende crystal structure as that of indium-phosphorus, is excellent in mechanical strength, and which can be produced comparatively inexpensively.

The metamorphic buffer layer, preferably, is composed of indium-phosphorus, indium-gallium-arsenic (InGaAs) or indium-aluminum-arsenic (InAlAs) or a combination of these materials. When used as the metamorphic buffer layer, the InP layer has the merit of a higher thermal conductivity as compared with the ternary mixed crystals, whereas the InGaAs layer and the InAlAs layer have the merit that the density of dislocations generated is the lowest.

In addition, it is preferable that the collector layer, the base layer and the emitter layer are formed of materials showing lattice matching with indium-phosphorus. In a specific preferable example, the collector layer is formed of indium-phosphorus, the base layer is formed of indium-gallium-arsenic, the emitter layer is formed of indium-phosphorus, and the emitter cap layer is formed of indium-gallium-arsenic. This is an example in the case where the HBT is a double hetero bipolar transistor (DHBT). The materials constituting the layers are determined by taking into account the band gaps and electrical characteristics of indium-phosphorus and indium-gallium-arsenic. Besides, the HBT may be a single hetero bipolar transistor (SHBT) in which the collector layer is formed of indium-gallium-arsenic.

The above configuration ensures that an indium-phosphorus semiconductor device excellent in high-frequency characteristics can be formed, in high yield, on the upper side of the gallium-arsenic substrate excellent in mechanical strength and comparatively inexpensive, with the metamorphic buffer layer therebetween, and that a heterojunction semiconductor device excellent in high-frequency characteristics can be obtained at a low manufacturing cost.

In addition, it is preferable that the impurity is introduced in the whole part or a part of the metamorphic buffer layer. Where the impurity is introduced in a part of the metamorphic buffer layer, preferably, the concentration of indium in the metamorphic buffer layer is increased continuously or step-wise in the layer thickness direction from the substrate side toward the active layer side, and the impurity is introduced in to the whole part of or to an intermediate depth in the semiconductor layer which is in contact with the active layer and in which the indium concentration is the highest.

Besides, the impurity is preferably introduced by an impurity doping method during crystal growth or by a diffusion method or an ion implantation method after crystal growth. The method for introducing the impurity is not particularly limited, and the just-mentioned methods may be used in combination.

Further, the concentration of the impurity is preferably not less than $1 \times 10^{19}/cm^3$. This ensures that a sufficient electrical conductivity is secured.

In addition, the impurity is preferably an n type impurity. An npn type HBT is of a structure excellent in high-speed operation performance. However, the HBT is not limited to the npn type, but the pnp type is recommendable where the magnitude of amplification factor is of great importance. In this case, the impurity introduced into the metamorphic buffer layer is a p-type impurity.

Besides, the collector electrode is preferably composed of a Ti/Pt/Au three-layer structure in which titanium, platinum and gold are laminated in this order. Such a laminate structure can realize good adhesion to and good ohmic contact with the underlying semiconductor layer.

Now, some preferred embodiments of the present invention will be described in detail below, referring to the drawings.

Embodiment 1

In Embodiment 1, an InP metamorphic HBT 10 and a manufacturing method thereof will be described as a working example of the present invention. In this embodiment, by a method of introducing an impurity while growing a crystal layer constituting the above-mentioned metamorphic buffer layer, the impurity is introduced into the whole part of the buffer layer.

FIG. 1 is a sectional diagram showing the structure of the metamorphic HBT 10 based on Embodiment 1.

In the metamorphic HBT 10, a metamorphic buffer layer 2, a collector layer 3, a base layer 4, an emitter layer 5, and an emitter cap layer 6 are sequentially laminated on a semi-insulating substrate 1 by an epitaxial growth method using a molecular beam epitaxy process (MBE process) or a metalo-organic chemical vapor deposition process (MOCVD process).

For example, the metamorphic HBT 10 is an npn type HBT, in which the metamorphic buffer layer 2 composed of a ternary mixed crystal $In_xGa_{1-x}As$ doped with an n$^+$ type impurity in a high concentration is laminated on the semi-insulating substrate 1 composed of gallium-arsenic (GaAs). The InGaAs layer, when formed as the metamorphic buffer layer 2 on the GaAs substrate 1, has the merit that the density of dislocations generated therein is the lowest.

At the lowermost portion, in contact with the GaAs substrate 1, of a lower layer 2a of the metamorphic buffer lower 2, the proportion x of indium is as low as x≈0, and the lattice constant of the metamorphic buffer layer 2 is at such a level as to permit lattice matching with the GaAs substrate 1. As the metamorphic buffer layer 2 is built up from the lower layer 2a to an intermediate layer 2b and then to an upper layer 2c, the proportion x of indium is increased continuously or stepwise, to reach x≈0.50 at the uppermost portion of the upper layer 2c, where the lattice constant of the metamorphic buffer layer 2 is at such a level as to show lattice matching with the indium-phosphorus material. The thickness of the buffer layer 2 is about 1 to 2 μm. Incidentally, as has been above-mentioned, the classification into the lower layer 2a, the intermediate layer 2b and the upper layer 2c is a functional or conceptual classification based on the differences of the mating materials with which these layers can make lattice matching, and, therefore, the classification does not mean that these layers form clear boundaries therebetween.

The layers constituting the metamorphic buffer layer 2 differ from each other in lattice constant, but are formed as a continuous single crystal. Strains are absorbed in the lower layer 2a and the intermediate layer 2b, so that transfer of dislocations to the upper layer 2c is prevented from occurring, whereby the lattice constant in the upper layer 2c can be orderly conditioned. As a result, chemical semiconductor layers 3 to 6 composed of InP materials which are the above-mentioned active layers can be grown on the upper layer 2c with good crystallinity.

In this case, in order to form a buffer layer having few dislocations and good crystallinity, it is desirable to form the metamorphic buffer layer 2 as a linear graded buffer layer in which the proportion x of indium increases not stepwise but continuously, starting from the layer of x≈0 which shows lattice matching with the GaAs substrate 1. On the other hand, in order to reduce the thickness of the metamorphic buffer layer 2, the growth of the metamorphic buffer layer 2 can be started from a buffer layer which has a somewhat higher proportion x of indium and which shows somewhat lattice mismatching with the GaAs substrate 1.

The collector layer 3 is an n$^-$ type InP layer having an impurity concentration of $1\times10^{16}/cm^3$, and has a thickness of 500 nm. The base layer 4 is a p$^+$ type InGaAs layer having an impurity concentration of not less than $1\times10^{19}/cm^3$, and has a thickness of 75 nm. The emitter layer 5 is an n$^-$ type InP layer having an impurity concentration of $1\times10^{17}/cm^3$, and has a thickness of 125 nm. The emitter cap layer 6 is an n$^+$ type InGaAs layer having an impurity concentration of not less than $1\times10^{19}/cm^3$, and has a thickness of 50 nm. This is an example in which the metamorphic HBT 10 is a double hetero bipolar transistor (DHBT).

It should be noted here that the materials of the layers, the impurity concentrations, and the layer thicknesses are not limited to the above-mentioned exemplary ones. Besides, the structures in which an arbitrary layer or layers are inserted for obviating discontinuity of energy band or an etching stopper layer or layers are inserted are also to be included in this embodiment.

For example, a structure may be adopted in which an n$^+$ type InP layer is laminated as the metamorphic buffer layer 2 on the GaAs substrate 1. The InP layer has the merit of a higher thermal conductivity as compared with the ternary mixed crystals. Since the InP layer has a high degree of mismatching in lattice constant with the GaAs substrate 1, many lattice dislocations exist in the lower layer 2a close to the GaAs substrate 1. However, the strains are absorbed as the metamorphic buffer layer 2 is built up, and transfer of the dislocations to the upper layer 2c is prevented from occurring, whereby the lattice constant in the upper layer 2c can be orderly conditioned. As a result, the chemical semiconductor layers 3 to 6 composed of InP materials and serving as the active layers can be grown with good crystallinity on the upper layer 2c of the metamorphic buffer layer 2 composed of the InP layer. In addition, a single hetero bipolar transistor (SHBT) in which the collector layer 3 is composed of indium-gallium-arsenic may also be adopted.

The emitter cap layer 6 and the emitter layer 5 are processed into a mesa form by photolithography and etching to form an emitter mesa, and the base layer 4 and the collector layer 3 are also similarly processed into a mesa form to form a base-collector mesa.

As for electrodes, an emitter electrode 9 is provided in contact with the emitter cap layer 6, a base electrode 8 is provided in contact with the base layer 4, and a collector electrode 7 as the above-mentioned electrode is provided in contact with the upper layer 2c of the metamorphic buffer layer 2. The metamorphic buffer layers 2a to 2c are so formed that the concentration of an n type impurity as the above-mentioned impurity is in the range of about $1\times10^{19}/cm^3$ to $1\times10^{20}/cm^3$, by an impurity doping process during crystal growth, and has an electrical conductivity equivalent to or higher than that of a sub-collector layer according to the related art. Therefore, the metamorphic buffer layers 2a to 2c can play the role of guiding the collector current smoothly to the collector electrode 7, in substitution for the sub-collector layer.

Accordingly, in the metamorphic HBT 10 based on this embodiment, the need for a sub-collector layer is eliminated, whereby the layer configuration can be simplified, and the lowering in thermal conductivity due to a sub-collector layer can be obviated. As a result, the heat release performance of the metamorphic HBT 10 can be improved, it is possible to enhance the output and to reduce the power consumption when the metamorphic HBT 10 is used as a power device, and the degradation of characteristics due to temperature variations can be reduced. In addition, variations of transistor characteristics and thermorunaway are restrained from occurring due to temperature variations, and reliability is enhanced. As a result, the need for a ballast resistance or the like is eliminated, so that it is possible to reduce the number of manufacturing process steps, to enhance productivity, and lower the manufacturing cost.

Besides, with the configuration as above, the indium-phosphorus semiconductor devices 3 to 6 excellent in high-frequency characteristics can be formed in good yield on the upper side of the gallium-arsenic substrate 1, which is excellent in mechanical strength and is comparatively inexpensive, with the metamorphic buffer layers 2a to 2c therebetween, and the heterojunction semiconductor device excellent in high-frequency characteristics can be obtained at a low manufacturing cost.

The materials of the electrodes 7 to 9 may be any materials that can make ohmic contact with the semiconductor layers in contact therewith. For example, as shown in the enlarged diagram in FIG. 1, a Ti/Pt/Au three-layer structure in which titanium, platinum and gold are laminated in this order or the like is preferably adopted, and the thicknesses of the layers are respectively set to be 50 nm/50 nm/200 nm. By adopting such a laminate structure, good adhesion to and good ohmic contact with the underlying semiconductor layer can be realized. For example, the contact resistance between the collector electrode 7 and the metamorphic buffer layer 2c can be suppressed to a desirable value of not more than 0.1 Ωmm.

FIGS. 2A to 2H are sectional diagrams illustrating the flow of manufacturing steps of the HBT 10 based on Embodiment 1.

Figure 2A:
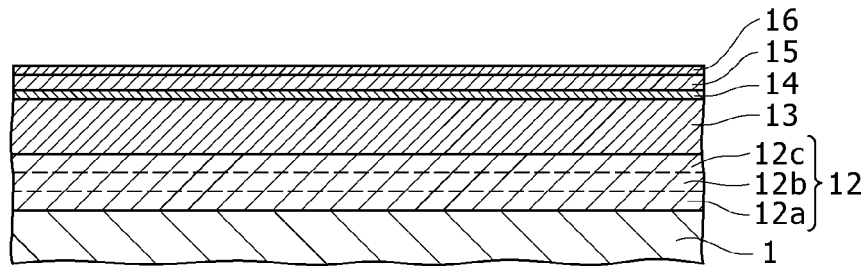
FIGS. 2A to 2H are sectional diagrams illustrating the flow of manufacturing steps of the metamorphic HBT shown in FIG. 1.

First, as shown in FIG. 2A, a gallium-arsenic substrate, for example, is prepared as the semi-insulating substrate 1. A metamorphic buffer constituting material layer 12, a collector constituting material layer 13, a base constituting material layer 14, an emitter constituting material layer 15, and an emitter cap constituting material layer 16 are formed on the semi-insulating substrate 1 by an epitaxy growth method using an MBE process or an MOCVD process.

For example, the details of the layers are as follows. The metamorphic buffer constituting material layer 12 is an n$^+$ type In$_x$Ga$_{1-x}$As layer doped with an impurity in a high concentration of $1\times10^{19}$/cm$^3$ to $1\times10^{20}$/cm$^3$, and the proportion x of indium is set as low as x≈0 at a lowermost portion of the metamorphic buffer constituting material layer lower layer 12a in contact with the GaAs substrate 1, for achieving lattice matching with the GaAs substrate 1. In addition, as the metamorphic buffer constituting material layer 12 is built up from the lower layer 12a to an intermediate layer 12b and then to an upper layer 12c, the proportion x of indium is gradually increased continuously, to reach x≈0.50 at an uppermost portion of the upper layer 12c, whereby the lattice constant is set to such a level as to permit lattice matching with an indium-phosphorus material. The thickness of the buffer layer 2 is set to about 1 to 2 μm. The InGaAs layer, when formed as the metamorphic buffer constituting material layer 12 on the GaAs substrate 1, has the merit that the density of dislocations generated is the lowest.

Besides, the collector constituting material layer 13 is an n$^-$ type InP layer having an impurity concentration of $1\times10^{16}$/cm$^3$, and has a thickness of 500 nm. The base constituting material layer 14 is a p$^+$ type InGaAs layer having an impurity concentration of not less than $1\times10^{19}$/cm$^3$, and has a thickness of 75 nm. The emitter constituting material layer 15 is an InP layer having an n$^-$ type impurity concentration of $1\times10^{17}$/cm$^3$, and has a thickness of 125 nm. The emitter cap constituting material layer 16 is an n$^+$ type InGaAs layer having an impurity concentration of not less than $1\times10^{19}$/cm$^3$, and has a thickness of 50 nm.

In this case, the impurity in each layer is introduced by an impurity doping process during crystal growth. For example, as an n type impurity in the metamorphic buffer constituting material layer 12, silicon (Si), germanium (Ge) or the like is introduced through pyrolysis of silane (SiH$_4$) gas or the like.

In addition, the metamorphic buffer constituting material layer 12 may be formed by laminating an n$^+$ InP layer. The InP layer has the merit of a higher thermal conductivity as compared with the ternary mixed crystals. Since the InP layer has a high degree of mis-matching in lattice constant with the GaAs substrate 1, many lattice faults exist in the lower layer 12a close to the GaAs substrate 1. However, the strains are absorbed as the metamorphic buffer layer is built up, and transfer of the dislocations to the upper layer 12c is prevented from occurring, whereby the crystal lattices in the upper layer 12c can be orderly conditioned. As a result, the chemical semiconductor constituting material layers 13 to 16 composed of the InP materials can be grown with good crystallinity as the active layers on the upper layer 12c of the metamorphic buffer constituting material layer 12 composed of the InP layer.

Figure 2B:
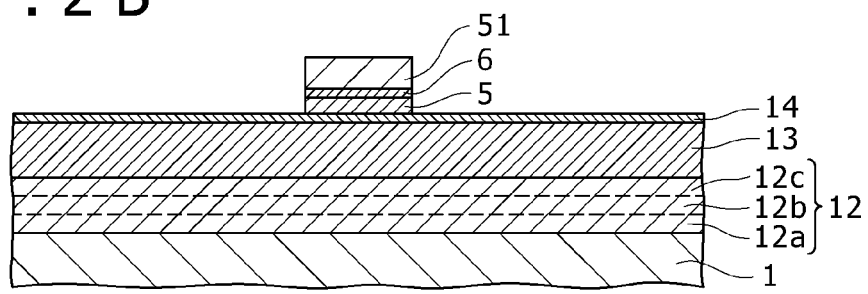

Next, as shown in FIG. 2B, a photoresist 51 is patternedly formed by photolithography, and, with the photoresist 51 as a mask, the emitter cap constituting material layer 16 and the emitter constituting material layer 15 are selectively etched, to form an emitter mesa composed of the emitter cap layer 6 and the emitter layer 5.

Figure 2C:
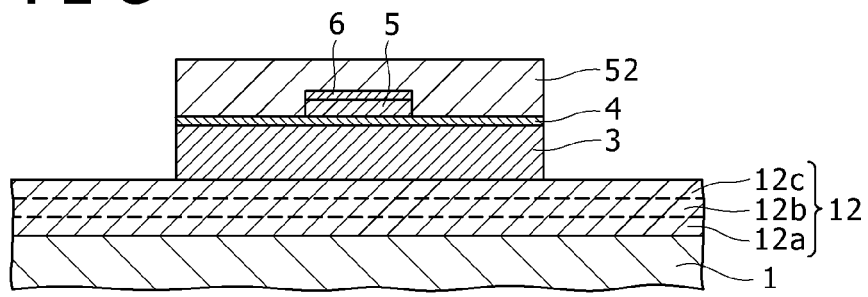

Subsequently, as shown in FIG. 2C, a photoresist 52 is patternedly formed by photolithography, and, with the photoresist 52 as a mask, the base constituting material layer 14 and the collector constituting material layer 13 are selectively etched, to form a base-collector mesa composed of the base layer 4 and the collector layer 3.

Figure 2D:
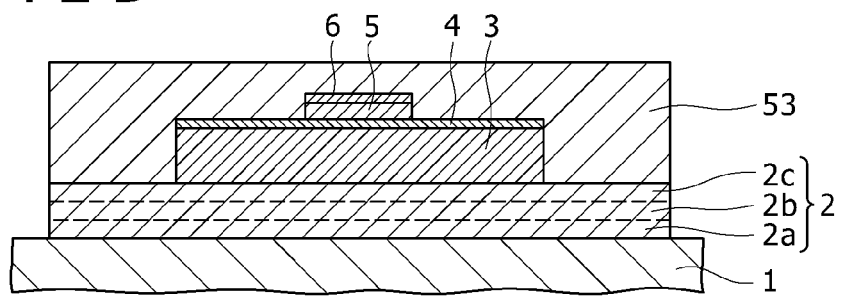

Next, as shown in FIG. 2D, a photoresist 53 is patternedly formed by photolithography, and, with the photoresist 53 as a mask, the metamorphic buffer constituting layer 12 is selectively etched until the substrate 1 is exposed, whereby a mesa-formed metamorphic buffer layer 2 is formed, and devices are electrically isolated from each other. Since the metamorphic buffer constituting material layer 12 is electrically conductive, in this embodiment, it is necessary, for isolation of the devices, to completely remove the metamorphic buffer constituting material layer 12 present in the regions between the devices.

Figure 2E:
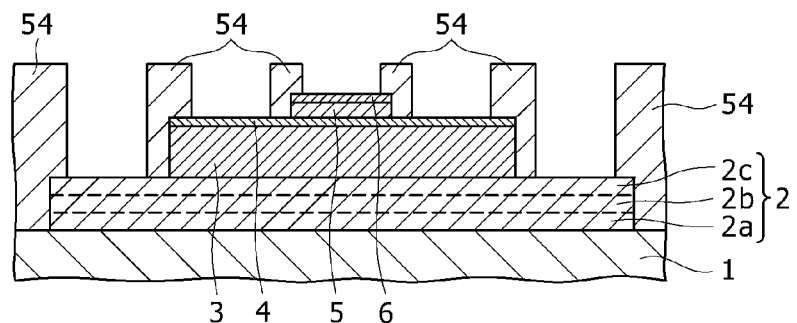
Figure 2F:
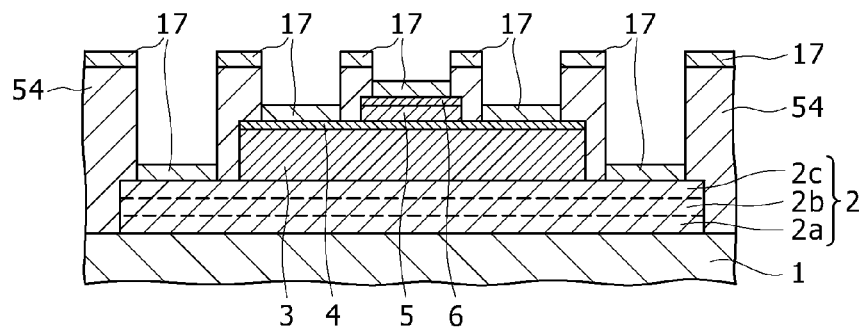
Figure 2G:
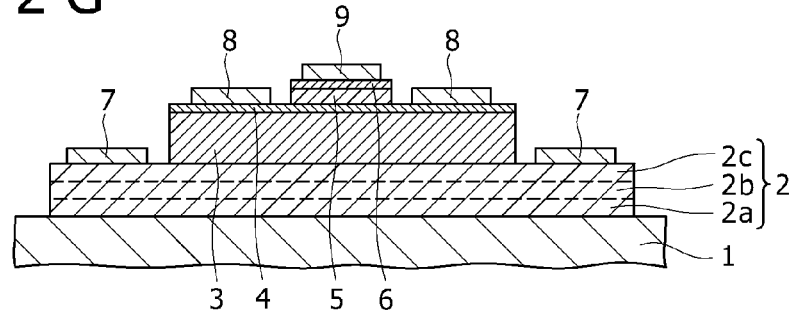

Subsequently, as shown in FIGS. 2E to 2G, a collector electrode 7, a base electrode 8, and an emitter electrode 9 are formed by a lift-off method. Specifically, first, as shown in FIG. 2E, a photoresist layer is formed over the whole surface by a coating method or the like, and is patterned by photolithography, to form a mask layer 54 covering other regions than the regions where the collector electrode 7, the base electrode 8 and the emitter electrode 9 are to be formed.

Next, as shown in FIG. 2F, an electrode material layer 17 composed, for example, of a Ti/Pt/Au three-layer structure in which titanium, platinum and gold are laminated in this order is formed on the whole surface by a vapor deposition process or the like so that the layer thicknesses are 50 nm/50 nm/200 nm, for example. Subsequently, as shown in FIG. 2G, the mask layer 54 is removed by dissolution, whereby the electrode material layer 17 built up on the mask layer 54 is removed, leaving only those portions of the electrode material layer 17 which are to be the collector electrode 7, the base electrode 8 and the emitter electrode 9. With each electrode provided with the above-mentioned laminate structure, the adhesion to and the ohmic contact with the underlying semiconductor layer can be realized. For example, the contact resistance between the collector electrode 7 and the metamorphic buffer layer 2c can be suppressed to a desirable value of not more than 0.1 Ωmm.

Figure 2H:
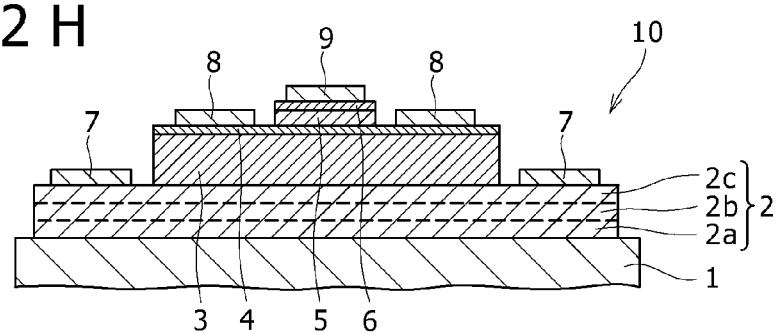

Next, if necessary, the substrate 1 is cut as shown in FIG. 2H, to separate the metamorphic HBTs 10 into individual chips. Alternatively, a semiconductor device may be formed which is composed of a plurality of metamorphic HBTs 10 on the substrate 1 as a common substrate. Subsequently, a wiring step and after-steps such as formation of a protective film are carried out by a known manufacturing method.

As has been described above, the method of manufacturing a heterojunction semiconductor device based on this embodiment uses only the established semiconductor technologies, so that it is possible by the method to manufacture the metamorphic HBT 10 efficiently and assuredly.

Embodiment 2

In Embodiment 2, an InP metamorphic HBT 20 and a manufacturing method thereof will be described as another working example of the present invention. In this embodiment, like in Embodiment 1, a method of introducing an impurity while growing a crystal layer constituting the above-mentioned metamorphic buffer layer is used. However, Embodiment 2 differs from Embodiment 1 in that the impurity is introduced only into the semiconductor layer in contact with the active layer, instead of introducing into the whole part of the buffer layer. The other points in Embodiment 2 are the same as in Embodiment 1. Therefore, the different points will mainly be described in the following.

Figure 3:
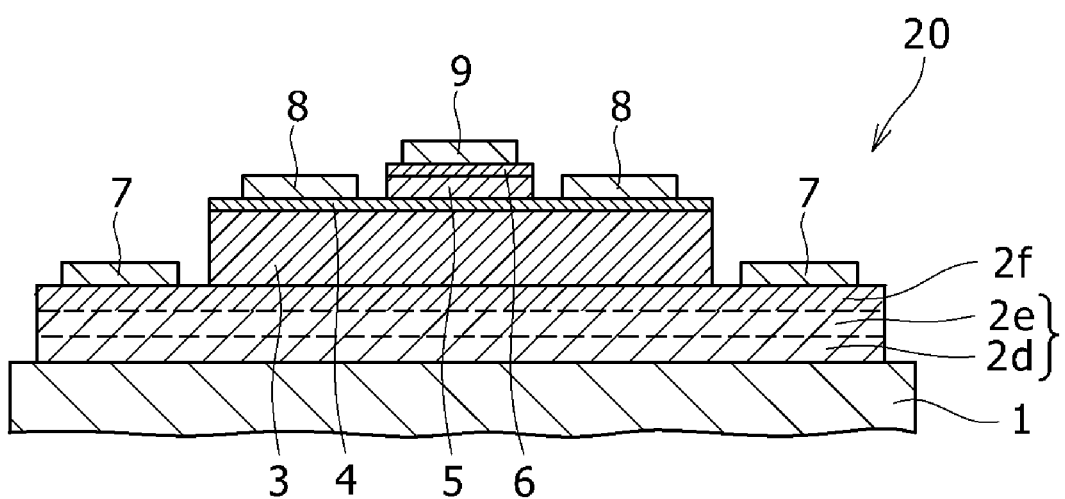
FIG. 3 is a sectional diagram showing the structure of a metamorphic HBT based on Embodiment 2 of the present invention.

FIG. 3 is a sectional diagram showing the structure of the metamorphic HBT 20 based on Embodiment 2. In Embodiment 2, like in Embodiment 1, a metamorphic buffer layers 2d to 2f, a collector layer 3, a base layer 4, an emitter layer 5, and an emitter cap layer 6 are sequentially laminated on a semi-insulating substrate 1 by an epitaxial growth method, and the layers are processed into mesa form by photolithography and etching. A collector electrode 7 as the above-mentioned electrode, a base electrode 8 and an emitter electrode 9 are provided in contact with the metamorphic buffer layer 2f, the base layer 4 and the emitter cap layer 6, respectively.

The materials of the layers, the impurity concentrations in the layers, and the layer thicknesses are the same as in Embodiment, except for the following points. In the metamorphic HBT 10 based on Embodiment 1, the metamorphic buffer layers 2a to 2c has been entirely doped with an impurity in a high concentration. In the metamorphic HBT 20 based on this embodiment, on the other hand, only the metamorphic buffer upper layer 2f being in contact with the collector layer 3 and provided with the collector electrode 7 is doped with an impurity in a high concentration, while the metamorphic buffer intermediate layer 2d and the metamorphic buffer lower layer 2e are not doped with an impurity. The other points in this embodiment are the same as in Embodiment 1, and, therefore, the details of the layers are omitted here, instead of being described again.

FIGS. 4A to 4H are sectional diagrams illustrating the flow of manufacturing steps of the HBT 20 based on Embodiment 2.

Figure 4A:
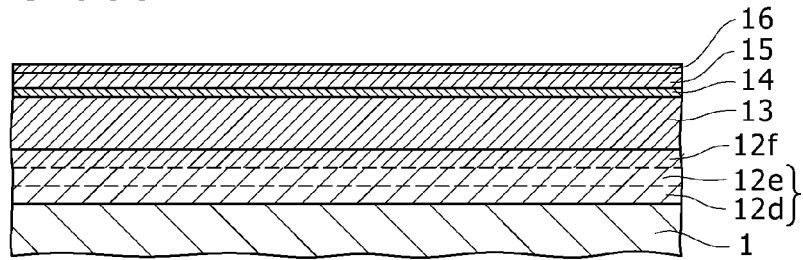
FIGS. 4A to 4H are sectional diagrams illustrating the flow of manufacturing steps of the metamorphic HBT shown in FIG. 3.
Figure 4B:
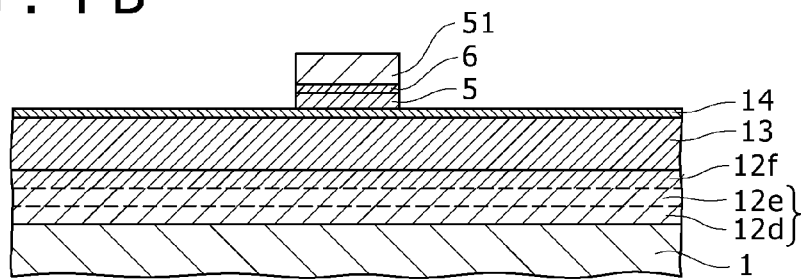
Figure 4C:
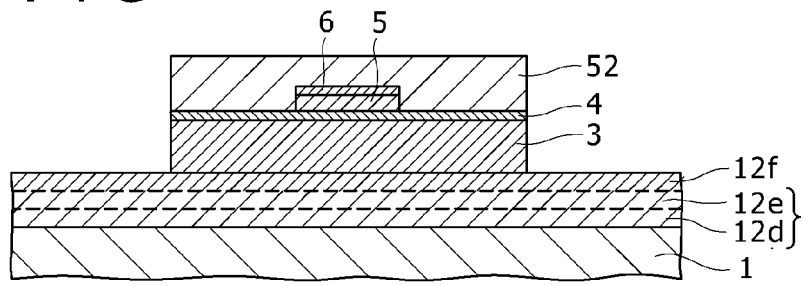

First, as shown in FIG. 4A, like in Embodiment 1, a metamorphic buffer constituting material layer 12, a collector constituting material layer 13, a base constituting material layer 14, an emitter constituting material layer 15, and an emitter cap constituting material layer 16 are formed on a semi-insulating substrate 1 such as a gallium-arsenic substrate by an epitaxial growth method using an MBE process or an MOCVD process.

In this case, in Embodiment 1, during the crystal growth for forming the metamorphic buffer constituting material layers 12a to 12c, the impurity has been introduced into the whole layer by the impurity doping method. In this embodiment, on the other hand, introduction of the impurity is not conducted during the crystal growth for forming the metamorphic buffer constituting material layers 12d and 12e, but is conducted only during the crystal growth for forming the metamorphic buffer constituting material layer 12f, to form the metamorphic buffer constituting material layer 12f doped with the impurity in a high concentration.

Next, like in Embodiment 1, in steps shown in FIGS. 5B and 5C, an emitter mesa composed of the emitter cap layer 6 and the emitter layer 5 and a base-collector mesa composed of the base layer 4 and the collector layer 3 are formed by photolithography and etching.

Figure 4D:
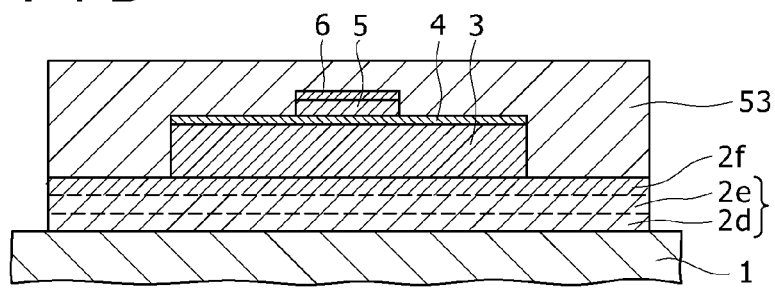

Subsequently, as shown in FIG. 4D, the metamorphic buffer constituting material layers 12d to 12f are patterned by photolithography and etching, whereby mesa-formed metamorphic buffer layers 2d to 2f are formed, and devices are electrically isolated from each other. In this embodiment, while the metamorphic buffer constituting material layer 12f is electrically conductive, the metamorphic buffer constituting material layers 12d and 12e are not electrically conductive. For device isolation, therefore, it suffices to only remove the metamorphic buffer constituting the material layer 12f present in the regions between the devices, and the metamorphic buffer constituting material layers 12d and 12e present in the regions between the devices may be left.

Figure 4E:
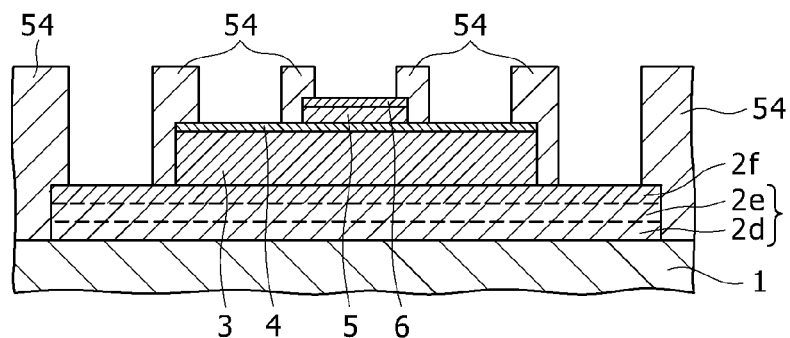
Figure 4F:
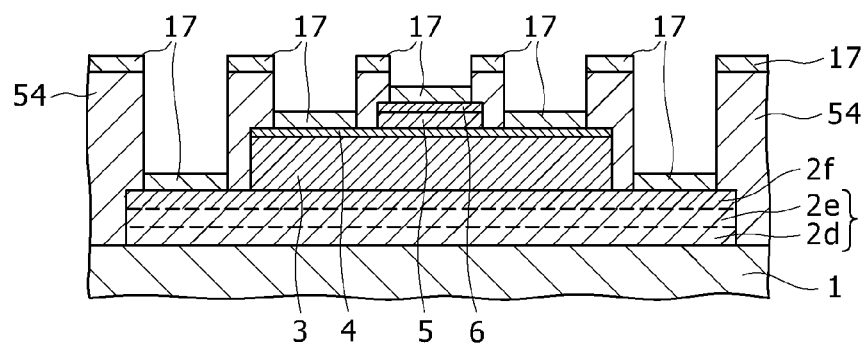
Figure 4G:
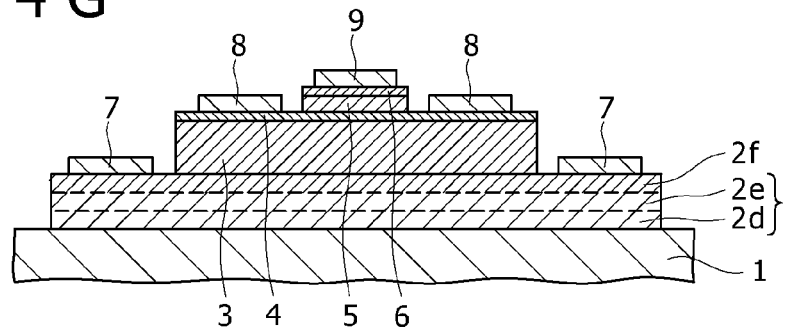
Figure 4H:
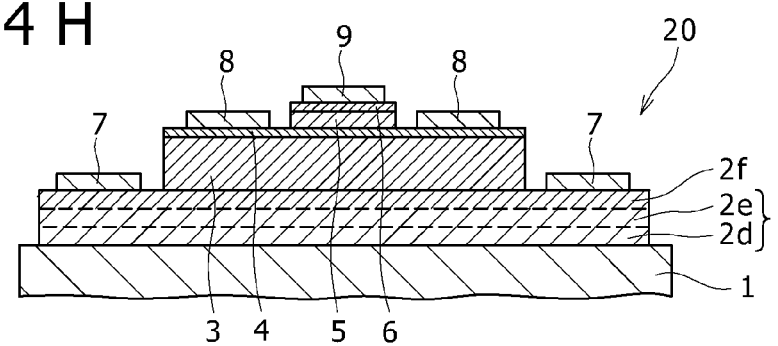

Next, like in Embodiment 1, as shown in FIGS. 4E to 4G, formation of the collector electrode 7, the base electrode 8, and the emitter electrode 9 is conducted by a lift-off method. Subsequently, if necessary, the substrate 1 is cut as shown in FIG. 4H, to separate the metamorphic HBTs 20 into individual chips. Alternatively, a semiconductor device may be formed which includes a plurality of metamorphic HBTs 20 on the substrate 1 as a common substrate. Subsequently, a wiring step and after-steps such as formation of a protective film are carried out by a known manufacturing method.

The metamorphic buffer upper layer 2f in the metamorphic HBT 20 is so formed that the concentration of an n type impurity as the above-mentioned impurity is in the range of about $1 \times 10^{19}/cm^3$ to $1 \times 10^{20}/cm^3$, by an impurity doping process during crystal growth, and has an electrical conductivity equivalent to or higher than that of a sub-collector layer according to the related art. Therefore, the metamorphic buffer upper layer 2f can play the role of guiding the collector current smoothly to the collector electrode 7, in substitution for the sub-collector layer. In this point, this embodiment is essentially the same as Embodiment 1.

Therefore, in the metamorphic HBT 20, the need for a sub-collector layer is eliminated, whereby the layer configuration can be simplified, and the lowering in thermal conductivity due to the sub-collector layer can be obviated. As a result, it is possible to improve the heat release performance of the metamorphic HBT 20, to enhance the output and reduce the power consumption when the metamorphic HBT 20 is used as a power device, and to reduce the degradation of characteristics due to temperature variations. In addition, variations in transistor characteristics and thermorunaway are restrained from occurring due to temperature variations, and reliability is enhanced. As a result, the need for a ballast resistance or the like is eliminated, so that it is possible to reduce the number of manufacturing process steps, to enhance productivity, and to lower the manufacturing cost.

Besides, like in Embodiment 1, an indium-phosphorus semiconductor devices 3 to 6 excellent in high-frequency characteristics can be formed in good yield on the upper side of the gallium-arsenic substrate 1, which is excellent in mechanical strength and comparatively inexpensive, with the metamorphic buffer layers 2d to 2f therebetween, and a heterojunction semiconductor device excellent in high-frequency characteristics can be obtained at a low manufacturing cost.

The method of manufacturing a heterojunction semiconductor device based on this embodiment uses only the established semiconductor technologies, and, therefore, it is possible by the method to manufacture the metamorphic HBT 20 efficiently and assuredly.

Embodiment 3

In Embodiment 3, an InP metamorphic HBT 30 and a manufacturing method thereof will be described as a further working example of the present invention.

In this embodiment, like in Embodiment 2, the above-mentioned impurity is introduced into only a semiconductor layer in contact with the above-mentioned active layer, of the crystal layers constituting the above-mentioned metamorphic buffer layer. However, this embodiment differs from Embodiment 2 as follows. In Embodiment 2, by use of the method of introducing the impurity while growing the metamorphic buffer layer, the impurity has been introduced into the whole part of the semiconductor layer. In this embodiment, on the other hand, after the metamorphic buffer layer is formed, the impurity is introduced to an intermediate depth in the semiconductor layer by an impurity diffusion method or an ion implantation method.

Figure 5:
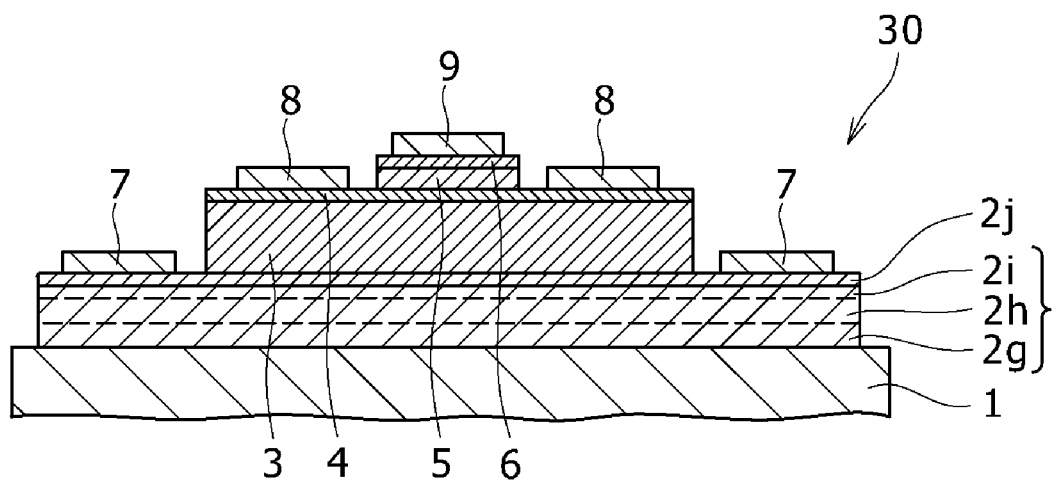
FIG. 5 is a sectional diagram showing the structure of a metamorphic HBT based on Embodiment 3 of the present invention.

FIG. 5 is a sectional diagram showing the structure of the metamorphic HBT 30 based on Embodiment 3. In the HBT 30, like in the HBT 10 and the HBT 20, metamorphic buffer layers 2g to 2i, a collector layer 3, a base layer 4, an emitter layer 5, and an emitter cap layer 6 are sequentially laminated on a semi-insulating substrate 1 by an epitaxial growth method, and are processed into mesa form by photolithography and etching. A collector electrode 7 as the above-mentioned electrode, a base electrode 8 and an emitter electrode 9 are provided in contact with the metamorphic buffer layer 2i, the base layer 4 and the emitter cap layer 6, respectively.

In the metamorphic HBT 30, like in the metamorphic HBT 20, a lower layer 2g and an intermediate layer 2h of the metamorphic buffer layer are not doped with an impurity. On the other hand, the metamorphic buffer upper layer 2i which is in contact with the collector layer 3 and provided with the collector electrode 7 is different from that in the metamorphic HBT 20. In the metamorphic HBT 20, the upper layer 2i has been wholly doped with the impurity. On the other hand, in the metamorphic HBT 30, a region 2j doped with the impurity in a high concentration is formed to an intermediate depth in the upper layer 2i. The materials of the other layers, the impurity concentrations in the other layers, and the layer thicknesses are the same as in Embodiments 1 and 2, and the description thereof will be omitted accordingly.

FIGS. 6A to 6I are sectional diagrams illustrating the flow of manufacturing steps of the HBT 30 based on Embodiment 3.

Figure 6A:
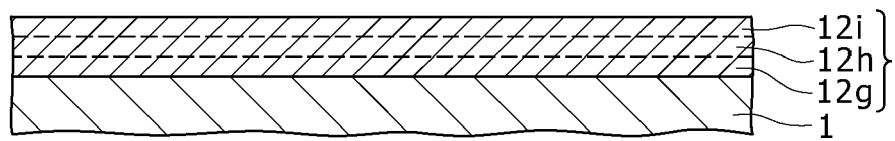
FIGS. 6A to 6I are sectional diagrams illustrating the flow of manufacturing steps of the metamorphic HBT shown in FIG. 5.

First, as shown in FIG. 6A, a gallium-arsenic substrate, for example, is prepared as the semi-insulating substrate 1. Metamorphic buffer constituting material layers 12g to 12i is formed on the substrate 1 by an epitaxial growth method using an MBE process or an MOCVD process. In this case, unlike in Embodiments 1 and 2, introduction of an impurity into the metamorphic buffer constituting material layers 12g to 12i is not conducted during the crystal growth.

Figure 6B:
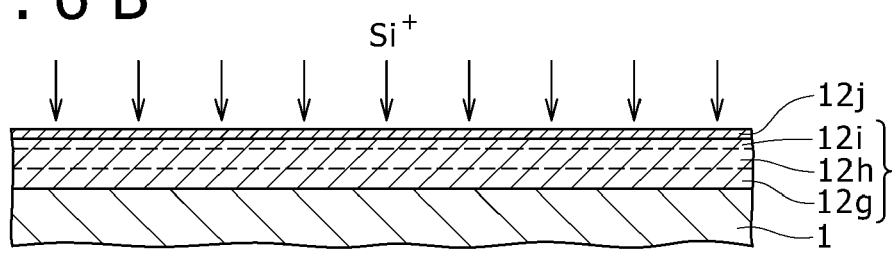

Next, the region 12j doped with the impurity in a high concentration is formed in the region ranging from the surface to an intermediate depth of the metamorphic buffer constituting material layer 12i, by introducing the impurity by an impurity diffusion process using silane gas or the like or by ion implantation of silicon ion $Si^+$ or the like shown in FIG. 6B. Thereafter, an activation annealing treatment is conducted so that the impurity concentration in the region 12j will be about $1 \times 10^{19}/cm^3$ to $1 \times 10^{20}/cm^3$.

Figure 6C:
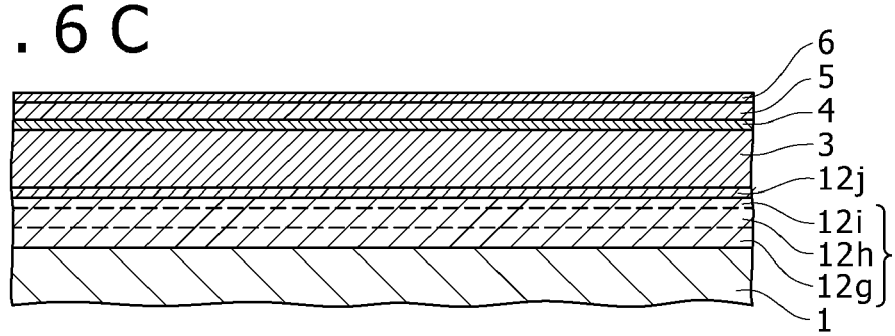

Subsequently, as shown in FIG. 6C, a collector constituting material layer 13, a base constituting material layer 14, an emitter constituting material layer 15, and an emitter cap constituting material layer 16 are formed on the metamorphic buffer constituting material layer 12i, again by an epitaxial growth method using an MBE process or an MOCVD process.

The steps to be conducted thereafter are the same as in Embodiment 2.

Figure 6D:
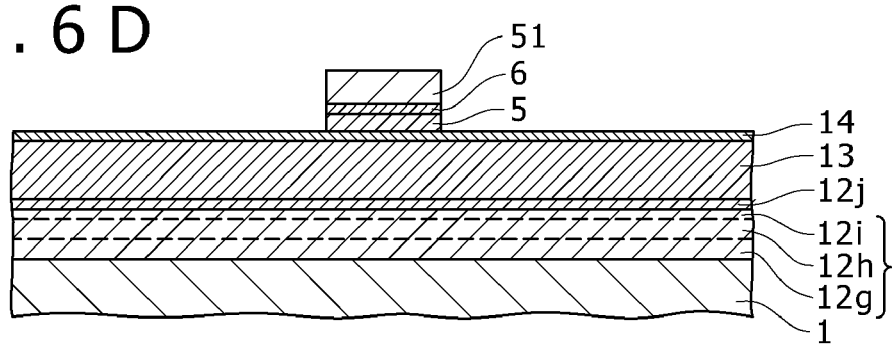
Figure 6E:
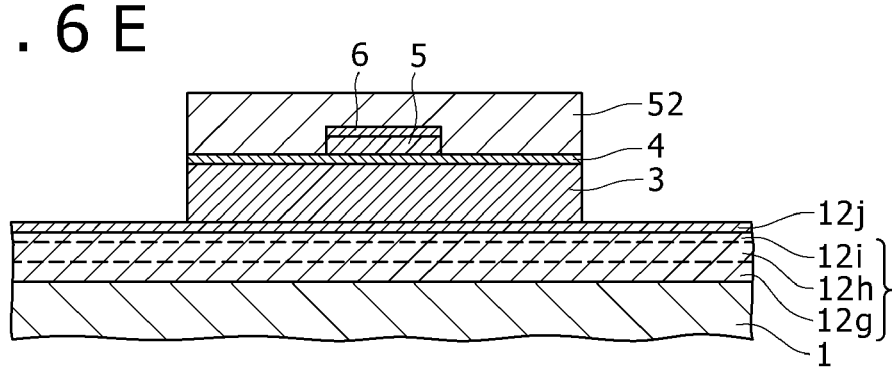

Specifically, first, in the steps shown in FIGS. 6D and 6E, an emitter mesa composed of the emitter cap layer 6 and the emitter layer 5 and a base-collector mesa composed of the base layer 4 and the collector layer 3 are formed by photolithography and etching.

Figure 6F:
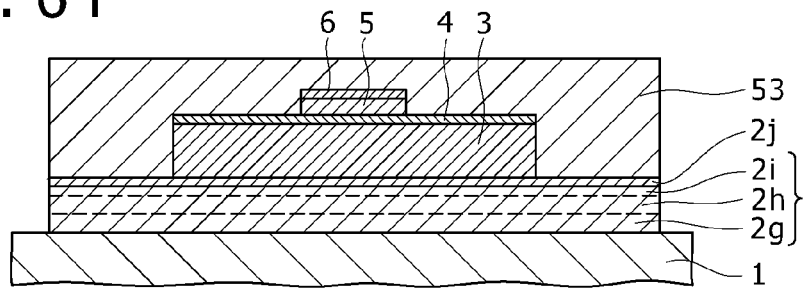

Next, as shown in FIG. 6F, the metamorphic buffer constituting material layers 12g to 12i are patterned by photolithography and etching, whereby mesa-formed metamorphic buffer layers 2g to 2i are formed, and devices are electrically isolated from each other. In this case, for isolation of the devices, it suffices to remove the conductive regions 12j of the metamorphic buffer constituting material layer 12i present in the regions between the devices, and the non-conductive metamorphic buffer constituting material layers 12g and 12h and the like present in the regions between the devices may be left.

Figure 6G:
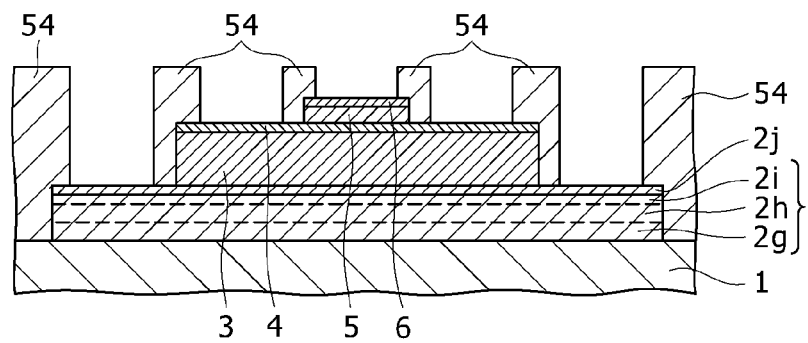
Figure 6H:
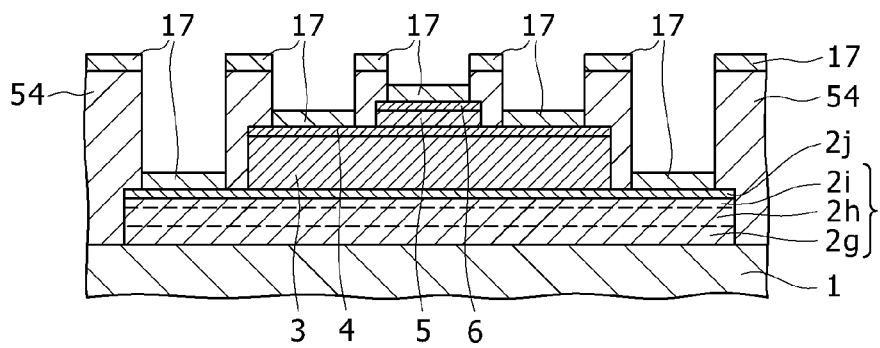
Figure 6I:
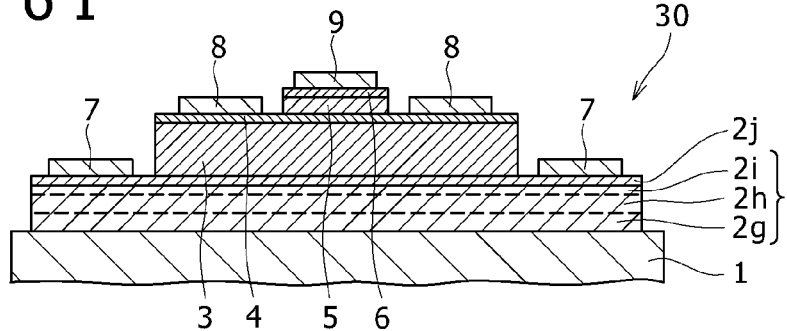
Figure 7:
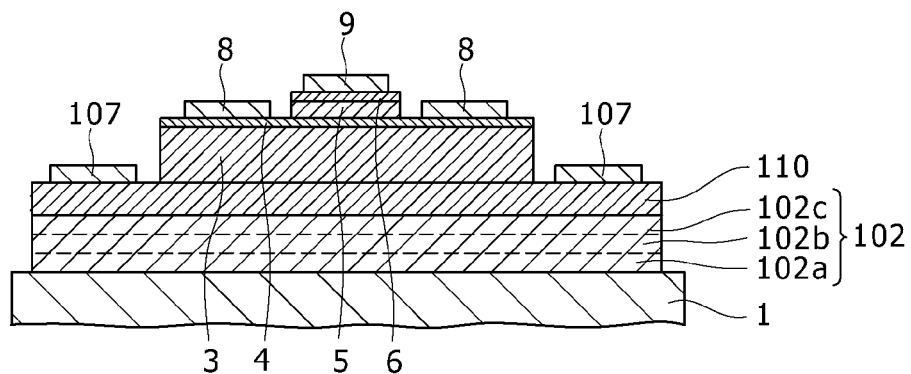
FIG. 7 is a sectional diagram showing the structure of a metamorphic HBT according to the related art.
Figure 8:
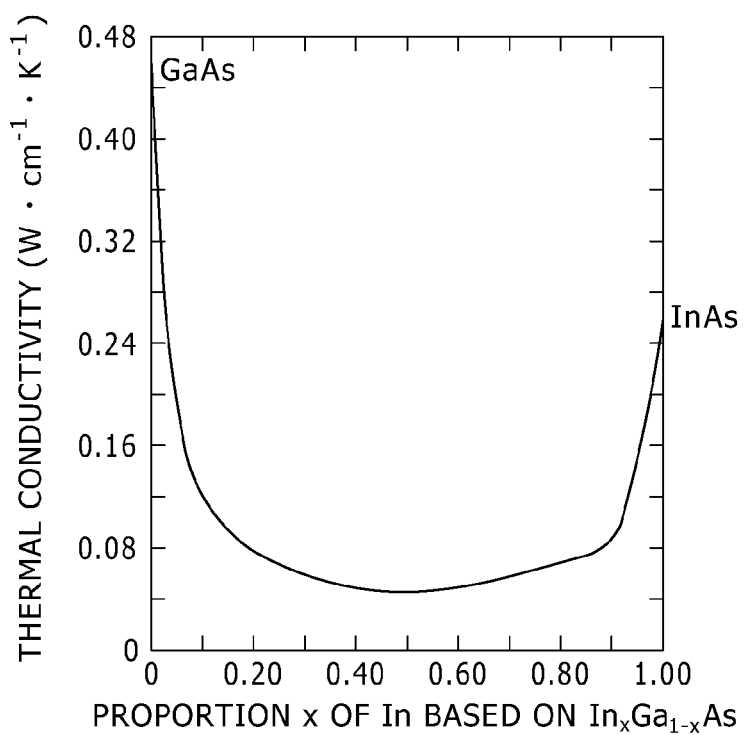
FIG. 8 is a graph showing the relationship between the proportion x of indium and thermal conductivity, of an indium-gallium-arsenic ternary system $In_xGa_{1-x}As$ at room temperature.

Subsequently, as shown in FIGS. 6G and 6H, formation of the collector electrode 7, the base electrode 8, and the emitter electrode 9 is conducted by a lift-off method. Next, if necessary, as shown in FIG. 6I, the substrate 1 is cut to separate the metamorphic HBTs 30 into individual pieces. Alternatively, a semiconductor device may be formed which includes a plurality of metamorphic HBTs 30 on the substrate 1 serving as a common substrate. Subsequently, a wiring step and after-steps such as formation of a protective film are carried out by a known manufacturing method.

The region 2j doped with the impurity in a high concentration, formed in the metamorphic buffer upper layer 2i, is so formed by an impurity diffusion method or an ion implantation method that the concentration of the impurity will be about $1 \times 10^{19}/cm^3$ to $1 \times 10^{20}/cm^3$, and the region 2j has an electrical conductivity equivalent to or higher than that of a sub-collector layer according to the related art. Therefore, the conductive region 2j doped with the impurity in a high concentration can play the role of guiding the collector current smoothly to the collector electrode 7, in substitution for the sub-collector layer. In this point, this embodiment is essentially the same as Embodiments 1 and 2.

Therefore, in the metamorphic HBT 30, the need for a sub-collector layer is eliminated, whereby the layer configuration can be simplified, and the lowering in thermal conductivity due to the sub-collector layer can be obviated. As a result, it is possible to improve the heat release performance of the metamorphic HBT 30, to enhance the output and reduce the power consumption when the metamorphic HBT 30 is used as a power device, and to reduce the degradation of characteristics due to temperature variations. In addition, variations in transistor characteristics and thermorunaway are restrained from occurring due to temperature variations, and reliability is enhanced. As a result, the need for a ballast resistance or the like is eliminated, making it possible to reduce the number of manufacturing process steps, to enhance productivity, and to lower the manufacturing cost.

Besides, like in Embodiments 1 and 2, indium-phosphorus semiconductor devices 3 to 6 excellent in high-frequency characteristics can be formed in good yield on the upper side of the gallium-arsenic substrate 1, which is excellent in mechanical strength and comparatively inexpensive, with the metamorphic buffer layers 2g to 2i therebetween, and a heterojunction semiconductor device excellent in high-frequency characteristics can be obtained at a low manufacturing cost.

The method of manufacturing a heterojunction semiconductor device based on this embodiment uses only the established semiconductor technologies, and, therefore, it is possible by the method to manufacture the metamorphic HBT 30 efficiently and assuredly.

While the present invention has been described above based on the preferred embodiments thereof, the invention naturally is not limited to or by the embodiments in any way, and various appropriate modifications are naturally possible within the scope of the gist of the invention.

The heterojunction semiconductor device and the method of manufacturing the same in the present invention are applicable to semiconductor devices such as a heterojunction bipolar transistor (HBT) including a Group III-V compound semiconductor, to be used in various electronic circuits so as to realize enhancement of the operating speed and the degree of integration, and the manufacturing method thereof. Particularly, the heterojunction semiconductor device and the method of manufacturing the same in the present invention can contribute to enhancement of performance and reliability and lowering of cost, of power devices.

What is claimed is:

1. A heterojunction semiconductor device comprising:
   a substrate;
   a metamorphic buffer layer on said substrate;
   an active layer on said metamorphic buffer layer, the active layer including a collector layer; and
   an electrode on said metamorphic buffer layer,
   wherein,
      said metamorphic buffer layer comprises indium-gallium-arsenic $In_xGa_{1-x}As$ in which $0 \leq x \leq 1$,
      part of said metamorphic buffer layer is between the collector layer and the substrate, the part being in contact with both the collector layer and the substrate,
      at least a portion of said metamorphic buffer layer in contact with said active layer contains an impurity introduced therein in a high concentration of at least $1 \times 10^{19}/cm^3$, and
      the impurity is not introduced into a region of said metamorphic buffer layer in which a concentration of indium is such that $x \approx 0$.

2. The heterojunction semiconductor device as set forth in claim 1, configured as a bipolar transistor in which said active layer includes at least the collector layer, a base layer and an emitter layer, and said electrode is a collector electrode.

3. The heterojunction semiconductor device as set forth in claim 1, wherein said metamorphic buffer layer is in lattice matching with indium-phosphorus (InP).

4. The heterojunction semiconductor device as set forth in claim 3, wherein said substrate is comprised of gallium-arsenic (GaAs).

5. The heterojunction semiconductor device as set forth in claim 1, wherein said collector layer, said base layer and said emitter layer are each comprised of a material capable of lattice matching with indium-phosphorus.

6. The heterojunction semiconductor device as set forth in claim 5, wherein said collector layer is comprised of indium-phosphorus, said base layer is comprised of indium-gallium-arsenic, said emitter layer is comprised of indium-phosphorus, and an emitter cap layer is comprised of indium-gallium-arsenic.

7. The heterojunction semiconductor device as set forth in claim 1, wherein said impurity is present in less than throughout said metamorphic buffer layer.

8. The heterojunction semiconductor device as set forth in claim 7, wherein the concentration of indium in said metamorphic buffer layer is increased continuously or stepwise in the layer thickness direction from said substrate side toward said active layer side, and said impurity is introduced into an intermediate depth in that semiconductor layer which is in contact with said active layer and in which the indium concentration is the highest.

9. The heterojunction semiconductor device as set forth in claim 1, wherein said impurity has been introduced by an impurity doping method during crystal growth or by a diffusion method or an ion implantation method after crystal growth.

10. The heterojunction semiconductor device as set forth in claim 1, wherein the concentration of said impurity is $1 \times 10^{19}/cm^3$ to $1 \times 10^{20}/cm^3$.

11. The heterojunction semiconductor device as set forth in claim 1, wherein said impurity is an n type impurity.

12. The heterojunction semiconductor device as set forth in claim 2, wherein said collector electrode has a Ti/Pt/Au three-layer structure in which titanium, platinum and gold are laminated in this order.

13. A method of manufacturing a heterojunction semiconductor device, comprising the steps of:
   forming a metamorphic buffer layer on a substrate;
   forming an active layer on said metamorphic buffer layer, the active layer including a collector layer; and
   introducing an impurity into at least a portion of said metamorphic buffer layer which is in contact with said active layer in a concentration of not less than $1 \times 10^{19}/cm^3$,
   wherein,
      said metamorphic buffer layer comprises indium-gallium-arsenic $In_xGa_{1-x}As$ in which $0 \leq x \leq 1$, part of said metamorphic buffer layer is between the collector layer and the substrate, the part being in contact with both the collector layer and the substrate, the impurity is not introduced into a region of said metamorphic buffer layer in which a concentration of indium is such that $x \cong 0$.

14. The method of manufacturing a heterojunction semiconductor device as set forth in claim 13, resulting in the heterojunction semiconductor device as set forth in any one of claims 2-4 and 5-12.

* * * * *